United States Patent [19]

Yorita et al.

[11] Patent Number: 4,680,560

[45] Date of Patent: Jul. 14, 1987

[54] ELECTRICAL FILTER DEVICE

[75] Inventors: Tadahiro Yorita; Haruo Matsumoto, both of Kanazawa; Itsuo Nakatsuji, Ishikawa, all of Japan

[73] Assignee: Murata Manufacturing Co., Ltd., Japan

[21] Appl. No.: 844,469

[22] Filed: Mar. 26, 1986

[30] Foreign Application Priority Data

Apr. 3, 1985 [JP] Japan .................................. 60-70395

Sep. 25, 1985 [JP] Japan ................................ 60-211891

[51] Int. Cl.[4] ....................... H01P 1/205; H01P 1/202; H03H 7/01

[52] U.S. Cl. .................................... 333/206; 333/184; 333/185

[58] Field of Search ................ 333/202, 203, 206–207, 333/260, 245, 222–225, 218, 167–168, 175–180, 181–185

[56] References Cited

U.S. PATENT DOCUMENTS

| | | | |
|---|---|---|---|
| 2,317,439 | 4/1943 | Buchholz | 333/206 |
| 2,577,510 | 12/1951 | Cohn | 333/206 |
| 3,480,887 | 11/1969 | Uhlir, Jr. . | |
| 3,909,755 | 9/1975 | Kaunzinger | 333/206 |
| 4,091,344 | 5/1978 | Latourette | 333/202 |
| 4,223,287 | 9/1980 | Nishikawa et al. | 333/206 |

FOREIGN PATENT DOCUMENTS

| | | | |
|---|---|---|---|
| 0041004 | 3/1982 | Japan | 333/203 |

*Primary Examiner*—Marvin L. Nussbaum

*Attorney, Agent, or Firm*—Ostrolenk, Faber, Gerb & Soffen

[57] ABSTRACT

An improved electrical filter device which is so arranged that a low-pass filter having a spurious wave eliminating function is formed into a compact size so as to be incorporated into a dead space within the filter device, while at the same time, high frequency characteristics of said low-pass filter itself are improved, without deteriorating characteristics of the filter device in which the low-pass filter is to be incorporated.

10 Claims, 27 Drawing Figures

ELECTRICAL FILTER DEVICE

BACKGROUND OF THE INVENTION

The present invention generally relates to an electrical filter device which employsdielectric coaxial resonators as filter elements and more particularly, to a filter of the above type having incorporated therein a lowpass filter having a spurious wave eliminating function.

Generally, as an electrical filter device, there has been known an arrangement which includes a plurality of dielectric coaxial resonators as filter elements and a substrate for coupling, incorporated into a casing, a plurality of capacitor electrodes formed on said coupling substrate and individually connected to inner conductors of the respective dielectric coaxial resonators, and coaxial connectors attached to the outer wall of said casing as input and output ports.

In the known filter as described above, there is a problem with respect to its performance, namely that, for example, when the resonators incorporated as the filter elements are ¼ wavelength type, the spurious wave suppression ratio for the higher harmonic which becomes an odd multiple wave of a fundamental wave is deteriorated, while when such resonators are of ½ wavelength type, the spurious wave suppression ratio for the higher harmonic which becomes an integral multiple wave of the fundamental wave is also deteriorated.

The electrical filter device of the above described type does not normally have a spurious wave eliminating function in itself, and therefore, in such a filter device, it has been a conventional practice to eliminate the spurious waves by externally connecting thereto, circuit components having the spurious wave eliminating function. In the conventional practice as described above, however, there is the disadvantage that additionanl circuit components are required, besides the original parts constituting the filter device, thus resulting in an undesirable increase in the number of parts involved.

In order to overcome the disadvantage as described above, filter devices have been conventionally proposed in which low-pass filters having a spurious wave eliminating function, or band cut-off filters, are incorporated as spurious wave eliminating filters, as shown in FIGS. 17(A), 17(B) and 17(C). In FIG. 17(A), a spurious wave eliminating filter (SEF) $4_0$ is connected to each of two band-pass filters (BPF) $5_0$ which are coupled in parallel relation to each other. In FIG. 17(B), a spurious wave eliminating filter (SEF) $4_0$ is connected to a junction of two band-pass filters (BPF) $5_0$ connected in parallel to each other, while in FIG. 17(C), a spurious wave eliminating filter (SEF) $4_0$ is connected in series with a band-pass filter (BPF) $5_0$.

In connection with the above, a low-pass filter is normally constituted by connecting inductors $L1_0$, $L3_0$ and $L5_0$ to a plurality of capacitors $C2_0$ and $C4_0$ employing a single dielectric member $1_0$ as shown in FIG. 16(*a*), or by connecting inductors $L1_0'$, $L3_0'$ and $L5_0'$ to a plurality of capacitors $C2_0'$ and $C4_0'$ employing a plurality of dielectric members $2_0$ and $3_0$ as illustrated in FIG. 16(B). In the constructions as described above, however, there is the problem that electromagnetic waves tend to leak therefrom, and unless a shielding function is imparted by some other means, high frequency characteristics are liable to be deteriorated.

On the other hand, a band cut-off filter is mainly so arranged as to produce a trap function at a particular frequency through utilization of a coaxial cable of a predetermined length. However, the band cut-off filter as described above can not remove spurious waves at a band region outside the predetermined cut-off region.

Besides the above, there is available a system which is adapted to impart a ground stray capacity to the resonators, thereby to deviate the band region for spurious waves, but by this system, the spurious waves themselves are not attenuated to a large extent, and therefore, effective elimination of spurious waves can not be expected.

As described so far, the conventional filter devices having the spurious wave eliminating function involve the problems that either the devices tend to be large in size on the whole, or sufficient spurious wave eliminating function can not be achieved.

SUMMARY OF THE INVENTION

Accordingly, an important object of the present invention is to provide an improved electrical filter device which is so arranged that a low-pass filter having a spurious wave eliminating function is formed into a compact size so as to be incorporated into a dead space within the filter device, while simultaneously, high frequency characteristics of said low-pass filter itself are improved, without deteriorating characteristics of the filter device in which the low-pass filter is to be incorporated.

Another important object of the present invention is to provide a filter device of the above described type, which is simple in construction and highly reliable in performance, and may be readily manufactured on a large scale at low cost.

In accomplishing these and other objects, according to one preferred embodiment of the present invention, there is provided an electrical filter device which includes a casing, a filter section incorporated in the casing, coaxial connectors mounted on outer walls of said casing and electrically connected to the filter section, with the casing having formed, in the outer walls thereof, insertion bores for inserting central conductors of the coaxial connectors thereinto, and a plurality of bushing members of a dielectric material fitted at predetermined intervals, between one of said insertion bores and a corresponding one of said central conductors and grounded to said casing, thereby to form capacitance between the casing and the central conductor, and also to form inductance by portions of said central conductor located in spaces adjacent to the respective bushing members.

By the arrangement according to the present invention as described above, each of the bushing members functions equivalently as capacitance between the grounded portion of the casing and the central conductor, with said central conductor acting as inductance in the space referred to above, and thus, a low-pass filter is constituted by the whole device.

In another aspect of the present invention, there is also provided an electrical filter device including a casing, filter elements incorporated in said casing, and input and output ports mounted on an outer wall of said casing, with said input and output ports being electrically connected to said filter elements, and characterized in that there is provided an axial low-pass filter between the filter elements and input and output ports, with the axial low-pass filter further including an outer conductor having an axial bore, capacitors each utilizing the outer conductor as an outer capacitor electrode and having a dielectric member with a cylindrical cross section, inductors connected to inner capacitor electrodes of said capacitors within a hollow interior of said outer conductor, and central conductors each connected to said inductors or inner capacitor electrodes of said capacitors.

In the above arrangement of the present invention, owing to the formation of the low-pass filter for the spurious wave elimination, into the compact axial shape, it has been made possible to assemble said low-pass filter into a portion considered as a dead space in the known filter devices, and the spurious wave eliminating function may be advantageously provided without altering the size of the conventional filter devices.

BRIEF DESCRIPTION OF THE DRAWINGS

These and other objects and features of the present invention will become apparent from the following description of preferred embodiments thereof with reference to the accompanying drawings, in which.

DETAILED DESCRIPTION OF THE INVENTION

Figure 1:
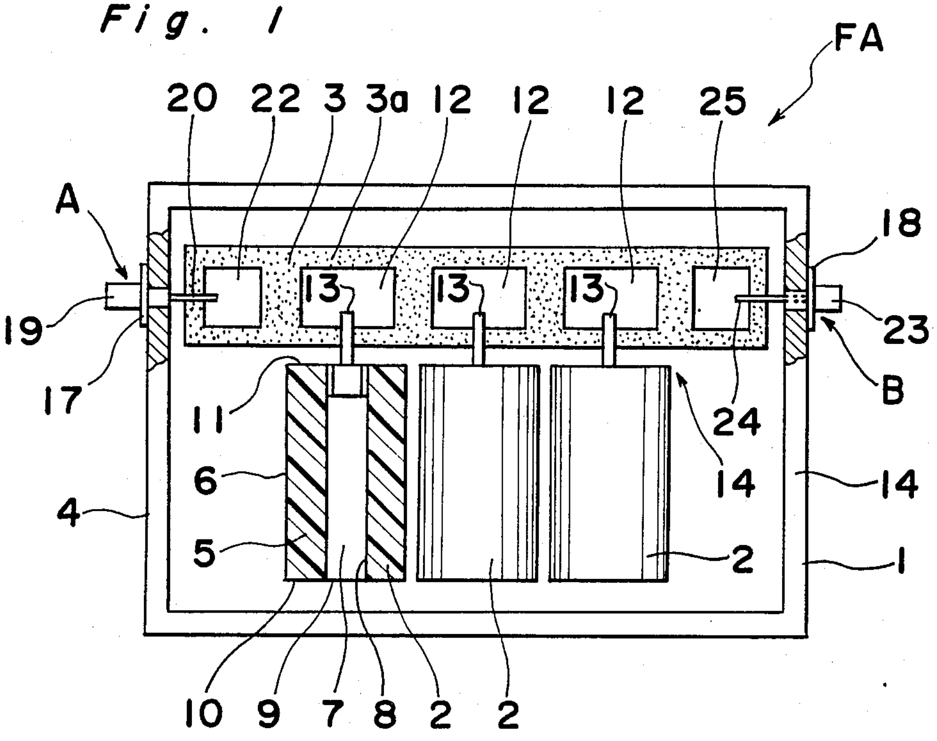
FIG. 1 is a side elevational view, partly in section, showing an electrical filter device according to one preferred embodiment of the present invention.

Before the description of the present invention proceeds, it is to be noted that like parts are designated by like reference numerals throughout the accompanying drawings.

Referring now to the drawings, there is shown in FIG. 1, an improved electrical filter FA according to one preferred embodiment of the present invention, which generally includes a casing 1 made, for example, of an aluminum alloy or the like, and a filter section 4 which acts as a band-pass filter, constituted by a plurality of dielectric coaxial resonators 2 as filter elements and a coupling substrate 3, and incorporated or assembled into said casing 1. Each of the resonators 2 referred to above is a so-called ¼ wavelength type dielectric coaxial resonator which further includes a cylindrical dielectric block 5 of a ceramic material having a through-bore 7 extending through its central portion, an outer conductor 6 formed on an outer peripheral face of said dielectric block 5, an inner conductor 8 formed on the inner peripheral face of said central through-bore 7, and an electrode 10 formed on one end face 9 of said block 5 for short-circuiting said inner conductor 8 and outer conductor 6, with the other end face 11 being adapted to be an open end face at which a bare face of the block 5 is exposed. The respective resonators 2 are disposed side by side so that the peripheral surfaces thereof contact each other, with the coupling substrate 3 being disposed at the side of the open end faces 11 thereof. The coupling substrate 3 includes a rectangular flat ceramic plate 3_a_, and a plurality of capacitor electrodes 12 formed on the ceramic plate 3_a_ in positions corresponding to said resonators 2. The capacitor electrodes 12 are respectively connected to the corresponding inner electrodes 8 of the resonators 2 through terminals 13.

Meanwhile, in the opposite sides walls 14 of the casing 1, there are formed insertion bores 15 and 16 (FIGS. 2 and 3), in which an input coaxial connector 17 and an output coaxial connector 18 are respectively fitted.

Figure 2:
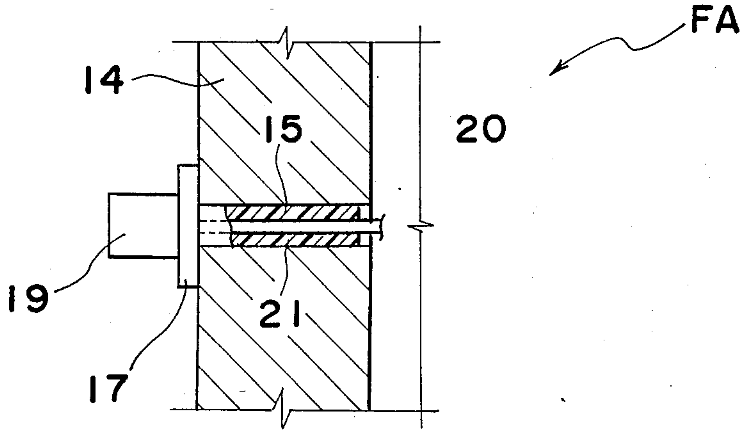
FIG. 2 is a fragmentary side sectional view showing on an enlarged scale, a portion A in FIG. 1.

More specifically, as illustrated in FIG. 2 showing a fragmentary side sectional view on an enlarged scale taken at a portion A in FIG. 1, the input coaxial connector 17 is disposed, with its connecting portion 19 projecting outwardly from the side wall 14 of the casing 1, and a central conductor 20 thereof is inserted into the insertion bore 15, while a dielectric bushing member 21 which covers the outer periphery of the central conductor 20 is closely fitted into the peripheral face of said insertion bore 15 in a conventional manner, with the forward end portion of said central conductor 20 being connected to an input electrode 22 formed at one end of said coupling substrate 3.

Figure 3:
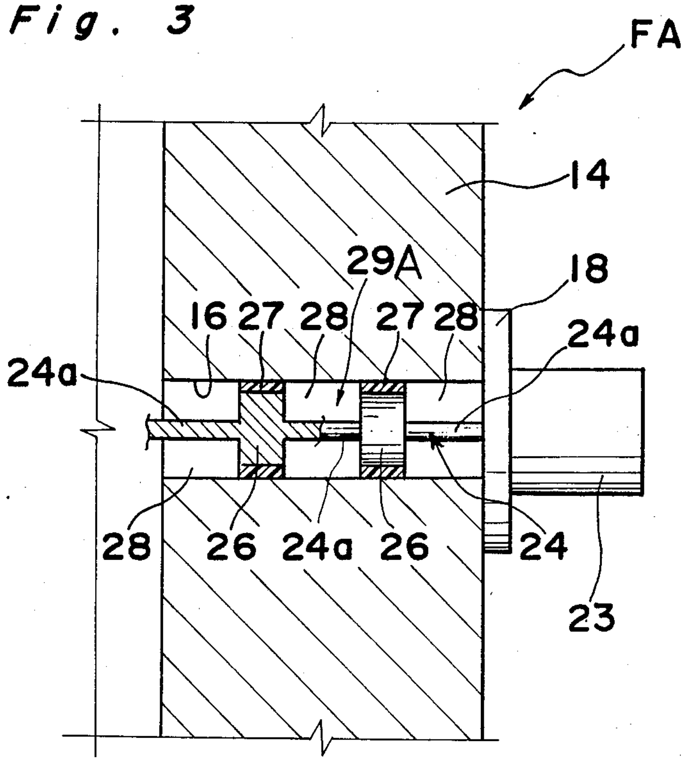
FIG. 3 is a fragmentary side sectional view showing on an enlarged scale, a portion B in FIG. 1.

Referring also to FIG. 3, there is shown a fragmentary side sectional view on an enlarged scale taken at a portion B in FIG. 1. In FIG. 3, the output coaxial connector 18 is provided in a similar manner as in the input coaxial connector 17, with its connecting portion 23 projecting outwardly from the side wall 14 and its central conductor 24 being inserted into the insertion bore 16. The forward end of the central conductor 24 of said output coaxial connector 18 is connected to an output electrode 25 formed at the other end of the coupling substrate 3. Meanwhile, the central conductor 24 is disposed at a central portion in a diametrical direction of the insertion bore 16, and is formed, on its intermediate portion within the insertion bore 16, with a plurality of enlarged diameter portions 26 at predetermined intervals depending on necessity. Onto each of the enlarged diameter portions 26, a bushing 27 having the same axial length as said enlarged diameter portion 26 and made, for example, of Teflon (name used in trade for polytetrafluoroethylene and manufactured by Du Pont) is applied to achieve close fitting with respect to the inner peripheral face of the insertion bore 16.

Figure 4:
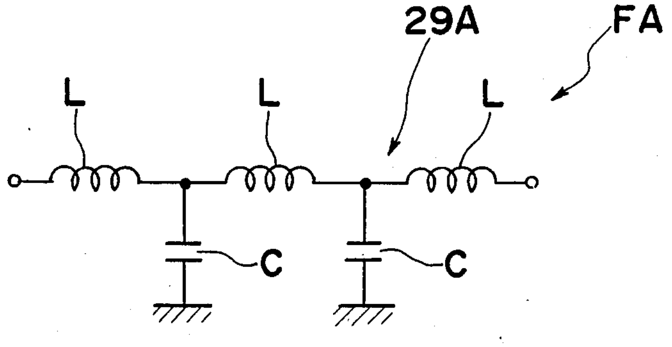
FIG. 4 is an electrical diagram showing an equivalent circuit for the filter device portion of FIG. 3.

In the above state, the respective bushing members 27 are grounded to the casing 1 through the insertion bore 16 to form capacitance C between said casing 1 and said central conductor 24, while inductance L is formed at portions 24*a* of the central conductor located in spaces 28 neighboring the respective bushing members 27, and thus, a low-pass filter portion 29A having a circuit construction as shown in an equivalent circuit of FIG. 4 is constituted in the output coaxial connector 18. It is to be noted here that the enlarged diameter portions 26 of the central conductor 24 are provided to set the capacitance value at the portions of the bushing members 27 as required.

By the arrangement of the embodiment as described so far, one example of the state of functioning of the filter device will be explained hereinbelow.

For example, upon input of a signal to the input coaxial connector 17, the signal is propagated to the first resonator 2 via the static capacitance between the input electrode 22 of the coupling substrate 3 and the capacitor electrode 12 at the initial stage, and successively propagated to the resonators 2 at the next stage and at the subsequent stage and so forth through the static capacitance between the respective capacitor electrodes, and thereafter, from the output electrode 25, passes through the low-pass filter portion 29A formed in the output coaxial connector 18 for removing at said portion 29A, the spurious wave at triple wave of the fundamental wave as contained in the input signal, so as to be subsequently transmitted to said output coaxial connector 18.

It is to be noted here that similar functions may be achieved even when the above directions for the input and output are reversed, and that, although the present invention has been described as applied to the low-pass filter of five stages in the foregoing embodiment, the number of stages may of course be altered as desired depending on necessity.

Figure 5:
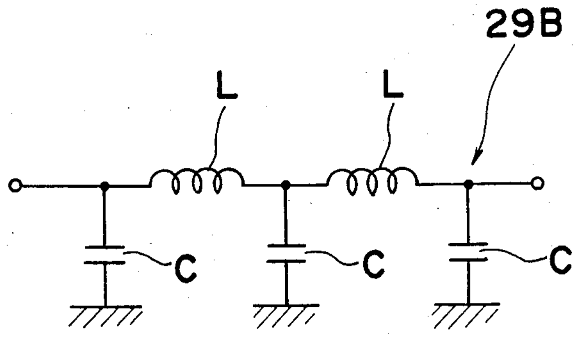
FIGS. 5 and 6 are electrical diagrams similar to FIG. 4, which particularly show equivalent circuits for modified filter devices of the present invention.
Figure 6:
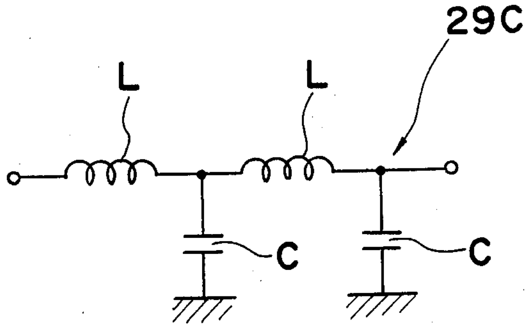

It should further be noted that, although the low-pass filter shown by the equivalent circuit 29A in FIG. 4 is represented in the form in which the inductance elements L are connected at the input and output ends, the present invention is not limited in its application to such embodiment alone, but may also be applied to a circuit construction in which capacitance elements C are connected to the input and output ends as in an equivalent circuit 29B of FIG. 5 or to a circuit construction in which an inductance element L is connected only to the input end, with the capacitance element C connected to the output end, as shown in an equivalent circuit 29C of FIG. 6, or vice versa.

As is seen from the foregoing description, according to the filter device of the present invention, it is so arranged that the plurality of bushing members made of a dielectric material are fitted, at the predetermined intervals, between the insertion bore formed in the outer wall of the casing and the central conductor of the coaxial connector disposed in said insertion bore, and said bushing members are grounded to the casing so as to form capacitance between the casing and the central conductor and also to form inductance by the portions of the central conductor located at spaces neighboring the respective bushing members, thereby forming the low-pass filter portion at part of said coaxial connector. Therefore, it has become possible to incorporate the low-pass filter into the filter device without a marked alteration of the conventional fundamental construction thereof, and thus, the filter performance may be improved through employment of a casing of a compact size. Moreover, since the basic construction of the coaxial connector is similar to that of the conventional coaxial connectors, cost increase for the formation of the low-pass filters may be suppressed.

Referring further to FIGS. 7(A) through 9, constructions of a rod-like or axial low-pass filter (referred to as an axial low-pass filter hereinbelow) to be incorporated into the filter device of the present invention will be described hereinbelow.

Figure 7A:
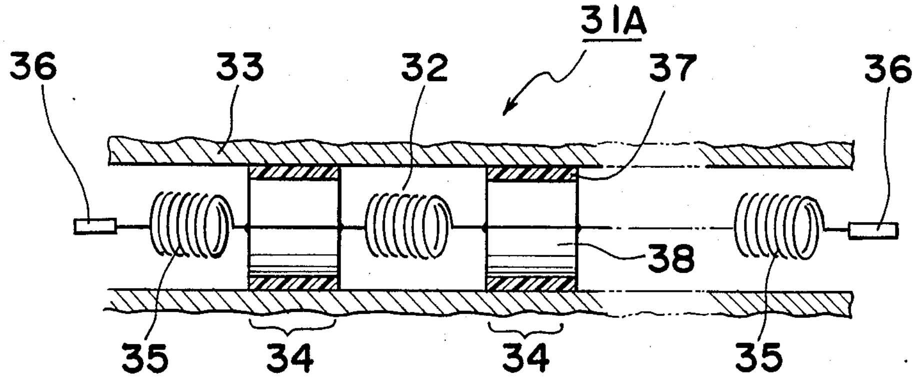
FIG. 7(A) is a fragmentary side sectional view of an axial low-pass filter to be employed in a filter device of the present invention.
Figure 7B:
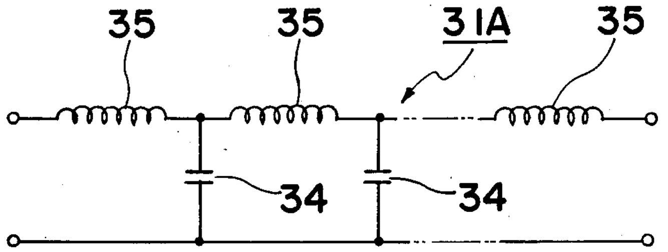
FIG. 7(B) is an electrical diagram showing an equivalent circuit thereof.

FIG. 7(A) shows the structure of the axial low-pass filter 31*a* of inductor input type, and FIG. 7(B) represents an equivalent circuit diagram thereof. As shown in FIG. 7(A), the axial low-pass filter 31A generally includes an outer conductor 33 formed with an axial bore 32 therein, and capacitors 34 each having a dielectric member 37, for example, of a cylindrical cross section, inductors 35, and central conductors 36 which are accommodated in said axial bore 32.

The outer conductor 33 referred to above is normally formed of a metallic material such as aluminum alloy, etc, but it may also be prepared from an electrically insulative material having an electrode layer over the inner peripheral surface of the axial bore 32. In other words, it is sufficient that such outer conductor is formed by a conductive material at least at the inner peripheral portion of its axial bore, with said conductive material portion being connected to ground, and the outer conductor may be formed into any external shape as long as it is provided with the axial bore 32.

The capacitors 34 and inductors 35 referred to above are alternately inserted into the hollow interior of the outer conductor 33 in the axial direction thereof. Each of the capacitors 34 utilizing the outer conductor 33 as an outer capacitor electrode, includes the cylindrical dielectric member 37 fitted to inscribe the hollow interior of the outer conductor 33, and an inner capacitor electrode 38 of a columnar or cylindrical shape which is fitted into the interior of the cylindrical dielectric member 37. The inductors 35 are connected to the inner capacitor electrodes 38 within the hollow interior of the outer conductor 33. In the above embodiment, the central conductors 36 are connected to the respective inductors 36 at the initial stage and the last stage.

Figure 8A:
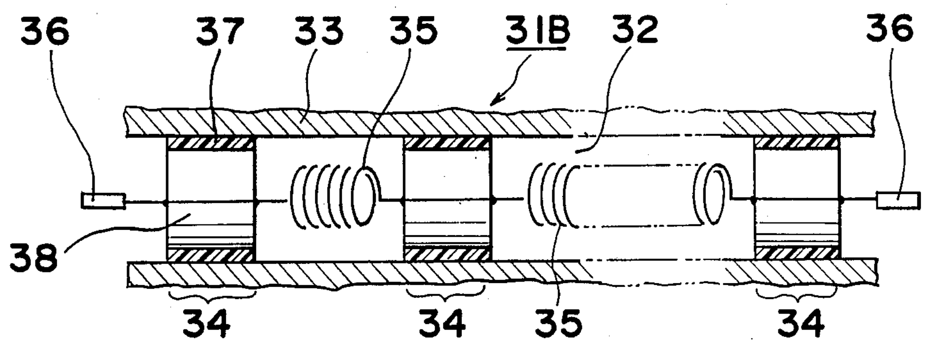
FIG. 8(A) is a view similar to FIG. 7(A), which particularly shows an axial low-pass filter of another type according to the present invention.
Figure 8B:
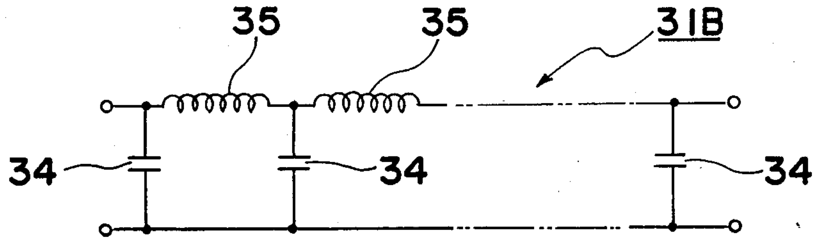
FIG. 8(B) is an electrical diagram showing an equivalent circuit thereof.

FIG. 8(A) shows the construction of the axial low-pass filter 31B of the capacitor input type, while FIG. 8(B) represents an equivalent circuit diagram thereof. In this embodiment, the outer conductor 33, capacitors 34 and inductors 35 having constructions similar to those in FIG. 7(A) may be employed, and the central conductors 36 in FIG. 8(A) are respectively connected to the inner capacitor electrodes 38 of the capacitors 34 at the initial stage and the last stage. In both of the above cases, although the capacitors and the inductors are connected to be in a symmetrical disposition, the arrangement is not limited to the above, but they may be connected to be in an asymmetrical disposition.

Figure 9:
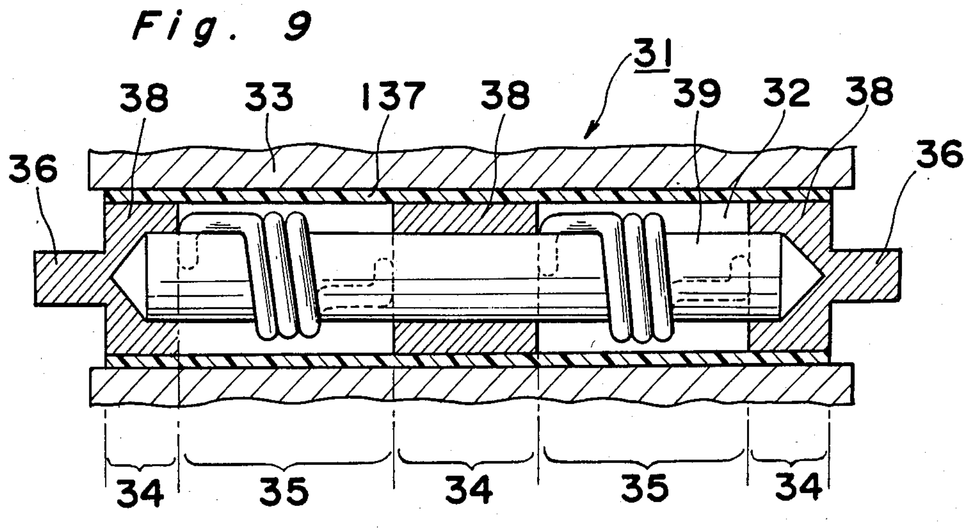
FIG. 9 is a fragmentary side sectional view showing one example of a specific construction of the axial low-pass filter according to the present invention.

Referring further to a side sectional view in FIG. 9, there is shown a specific construction of a five stage axial low-pass filter of capacitor input type.

In the axial low-pass filter 31 of FIG. 9, the dielectric member 137 for constituting the plurality of capacitors 34 (in three stages in this embodiment) is of a continuous long cylindrical member in one unit, and formed from a heat-shrinkable tube, for example, of PTFE (polytetrafluoroethylene), polyester or the like. Meanwhile, at the position of an axis for the inner capacitor electrode 38 for each capacitor 34, one insulating rod 39 is inserted, with the inductor being wound around said insulating rod 39. One central conductor 36 is connected to the inner capacitor electrode 38 of the capacitor 34 at the initial stage, while the other central conductor 36 is coupled with the inner capacitor electrode 38 of the capacitor 34 at the last stage. In the axial low-pass filter 31 of FIG. 9, like parts in FIGS. 7(A) and 8(A) are designated by like reference numreals for brevity of description.

By the above construction of FIG. 9, the portions excluding the outer conductor 33 of the axial low-pass filter 31 are collected into one rod-like member, and thus, handling is facilitated in assembly work, etc.

Subsequently, referring to FIGS. 10(A) through 12, constructions of filter devices in which the axial low-pass filter 31 as described above may be incorporated, will be explained.

In the case where the dielectric coaxial resonator which is the filter element for constituting the filter device is of $\frac{1}{4}$ wavelength, the axial low-pass filter 31 may be formed into an axial length generally equal to that of the resonator, and therefore, as shown in fragmentary cross sections in FIGS. 10(A) through 10(F), the axial low-pass filters 31 may be incorporated in a side wall of the casing or within a space in the casing.

Figure 10A:
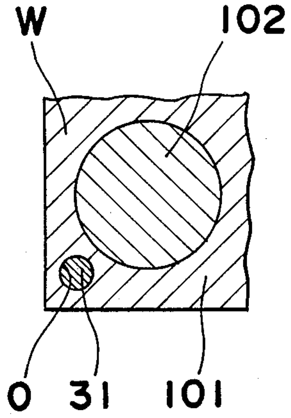
FIGS. 10(A) through 10(F) are fragmentary sectional views of filter devices according to the present invention, which show various states of incorporation of the axial low-pass filters.
Figure 10B:
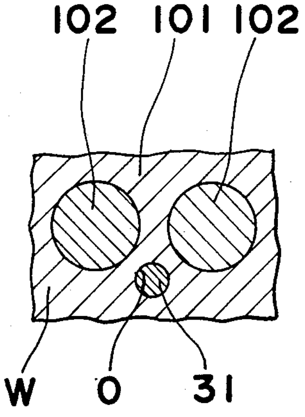
Figure 10C:
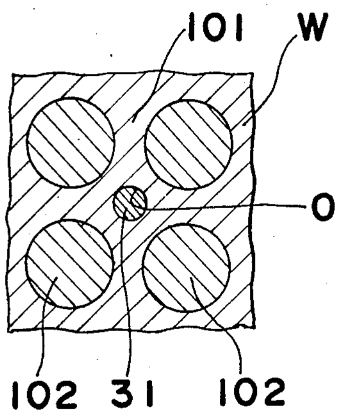

More specifically, in each embodiment of FIGS. 10(A) to 10(C), an axial bore O is formed in the wall portion W of the casing 101, for example, between the resonator 102 and the outer face of the casing 101, or between the resonators 102 adjacent to each other, which wall portion W has been conventionally regarded as a dead space in a filter device, and such an axial bore O is utilized as the outer conductor 33 of the axial low-pass filter 31 inserted in said wall portion.

Figure 10D:
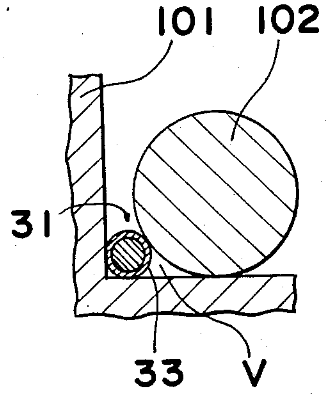
Figure 10E:
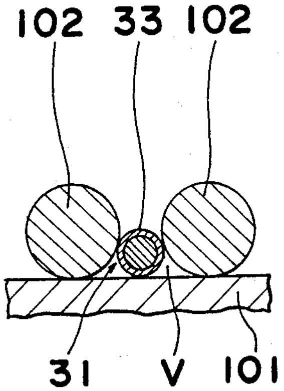
Figure 10F:
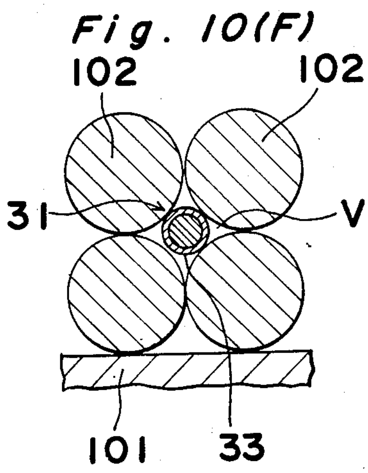

Meanwhile, in each embodiment of FIGS. 10(D) to 10(F), a space V located between the resonator 102 and the outer face of the casing 101 or between the neighboring resonators 102 and conventionally regarded as a dead space, is utilized to accommodate therein the axial low-pass filter having the cylndrical outer conductor 33.

Figure 11:
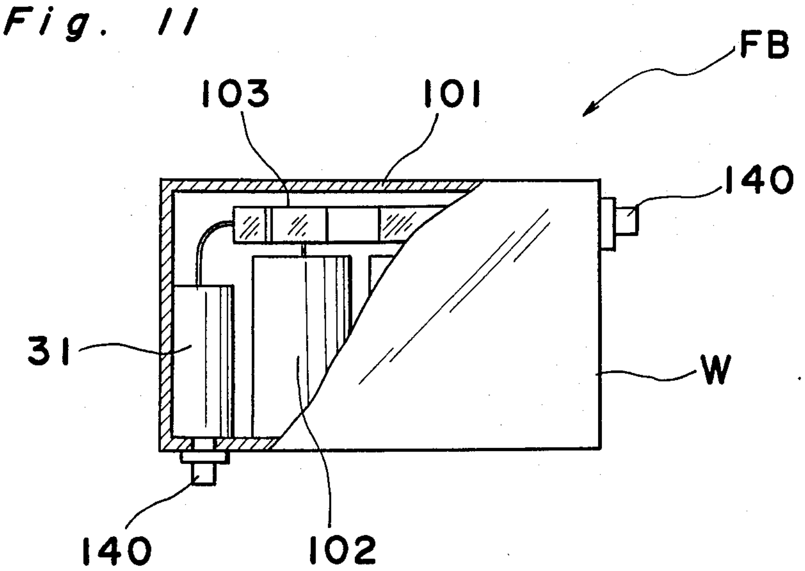
FIG. 11 is a side elevational view partly broken away, of a single filter device in which the axial low-pass filter of the present invention is incorporated.

Referring to FIG. 11, there is shown a single unit filter device FB in which the axial low-pass filter 31 as described so far has been incorporated.

The filter device FB includes dielectric coaxial resonators 102 as the filter elements and the coupling substrate 103 which are incorporated in the casing 101, a plurality of capacitor electrodes formed on the coupling substrate 103 and individually connected to the inner conductors of the respective resonators 102, the coaxial connectors 140 mounted on the outer wall W of the casing 101 as input and output ports, and the axial low-pass filter 31 provided between one coaxial connector 140 and the input or output electrode of said coupling substrate 103.

One example of the functioning of the above filter device FB will be described hereinafter.

The signal as applied to the input coaxial connector 140 (for example at the upper right portion in FIG. 11), is propagated to the resonator 102 as the initial stage through the static capacity between the input electrode on the coupling substrate 103 and the capacitor electrode at the initial stage, and thereafter, is successively propagated to the next resonator 102, the resonator subsequent thereto and so forth, through the static capacity between the respective capacitor electrodes on the coupling substrate 103, and then, applied to the axial low-pass filter 31 from the output electrode on the coupling substrate 103 for removal of spurious component contained in the input signal at said low-pass filter 31 so as to be subsequently outputted from the output coaxial connector 140 (at the lower left portion in FIG. 11).

In the above case, since the axial low-pass filter 31 is grounded through the outer conductor 33 at its outer peripheral portion, it has less leakage of electromagnetic waves, with superior high frequency characteristics, and is capable of removing the spurious component over a wide band region.

It should be noted here that, similar functioning as above may be achieved, even if the input and output directions of the signal are reversed.

Figure 12:
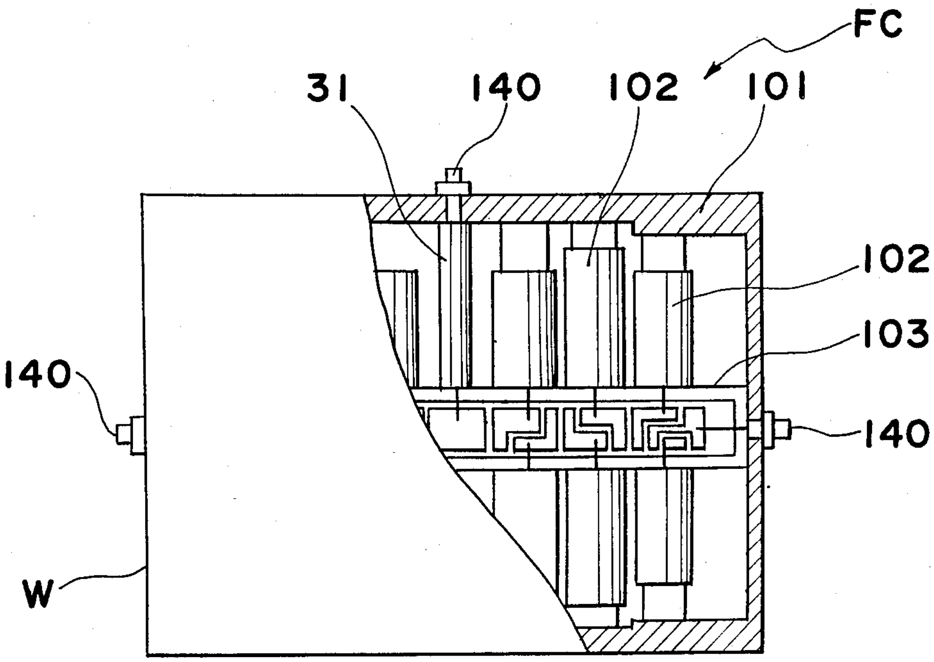
FIG. 12 is a side elevational view partly broken away, of a common use filter device in which the axial low-pass filter of the present invention is incorporated.

Referring further to FIG. 12, there is shown a common use filter device FC in which the axial low-pass filter 31 as described earlier has been incorporated.

Figure 17A:
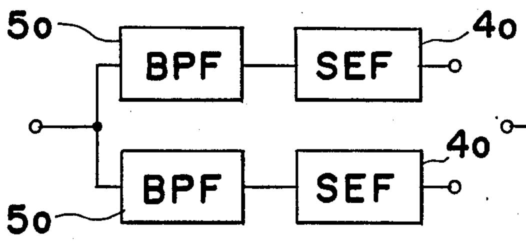
Fig. 17(A) PRIOR ART
FIGS. 17(A), 17(B) and 17(C) are electrical block diagrams showing conventional filter devices provided with spurious wave eliminating filters (already referred to).
Figure 17B:
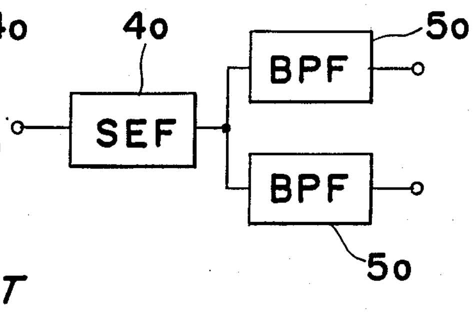
Fig. 17(B) PRIOR ART
Figure 17C:
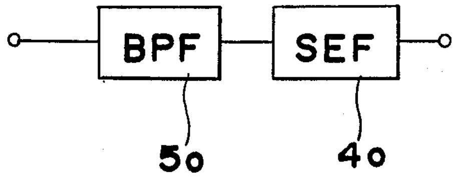
Fig. 17(C) PRIOR ART

The filter device FC includes a plurality of dielectric coaxial resonators 102 and the coupling substrate 103 which are incorporated in the casing 101, a plurality of capacitor electrodes formed on the coupling substrate 103 and individually connected to the inner conductors of the respective resonators 102, the coaxial connectors 140 mounted on the outer wall W of the casing 101 either for an antenna input or output or exclusively for input from a transmitter or output to a receiver, for example, and the axial low-pass filter 31 provided between the coaxial connector 140 for the antenna and the input and output electrode of said coupling substitute 103. The above arrangement is characterized in that, as in the conventional filter device of FIG. 17(B) referred to earlier, by employing one low-pass filter at the common use portion of the two filters, spurious component for the both filters is suppressed, with the reduction of the external size.

Figure 13:
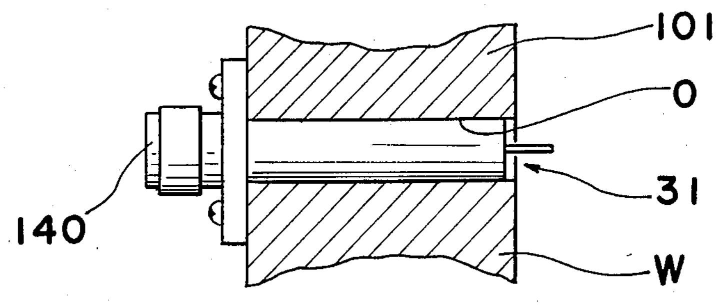
FIGS. 13, 14 and 15 are fragmentary side sectional views showing different embodiments for incorporating the axial low-pass filters into filter devices.
Figure 14:
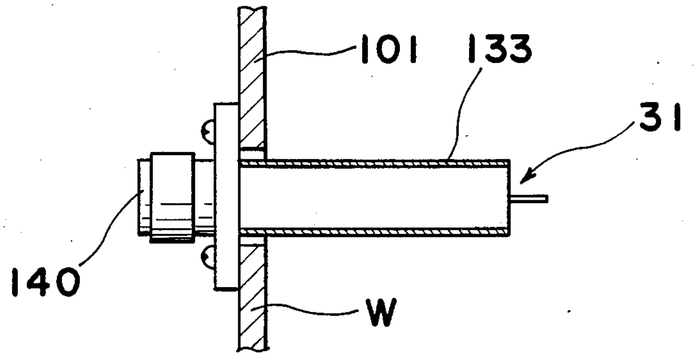
Figure 15:
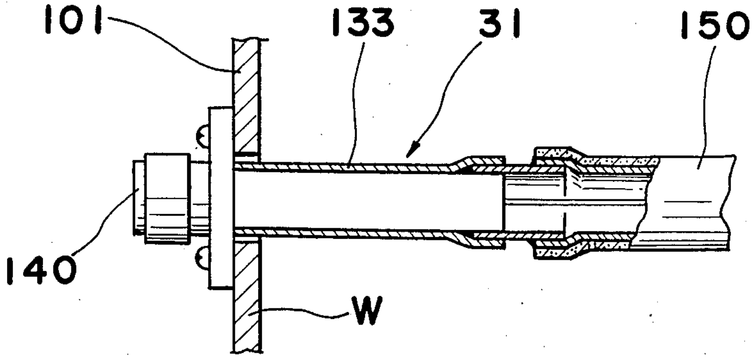
Figure 16A:
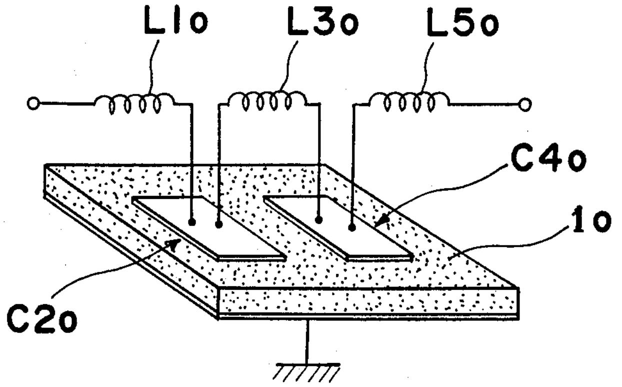
Fig. 16(A) PRIOR ART
FIGS. 16(A) and 16(B) are schematic perspective views showing constructions of conventional low-pass filters for eliminating spurious waves (already referred to)
Figure 16B:
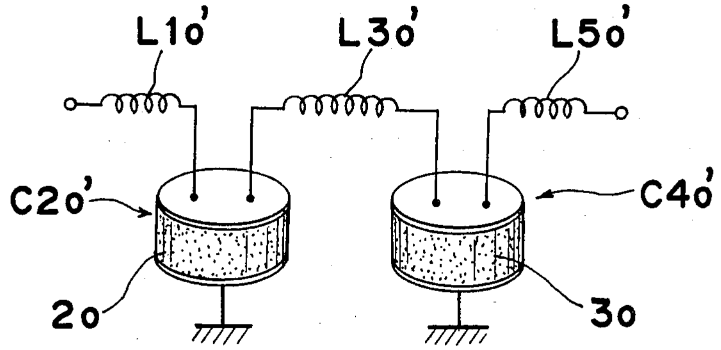
Fig. 16(B) PRIOR ART

When the axial low-pass filter 31 is to be directly connected to the coaxial connector 140 as in the filter device FB or FC in FIG. 11 or 12, such coaxial connector 140 may be formed into one unit with the axial low-pass filter 31 as shown in the embodiment of FIG. 13, 14 or 15. In this case, it is preferable to integrally form the central conductor of the coaxial connector 140 with one of the central conductors 36 of the axial low-pass filter 31.

In the case where the thickness of the outer wall portion W of the casing 101 is equal to the axial length of the axial low-pass filter 31, for example, when the low-pass filter is incorporated into a die-cast casing 101, an axial bore O is formed in the outer wall of the casing 101 as shown in FIG. 13, and this axial bore portion is utilized as the outer conductor 33 of the axial low-pass filter 31, and the portion of the axial low-pass filter 31 without its outer conductor 33 is inserted into said axial bore O.

Meanwhile, in the case where the thickness of the outer wall portion W of the casing 101 is thin as compared with the axial length of the axial low-pass filter, for example, as in the case where the axial low-pass filter 31 is to be assembled into a sheet-metal casing 101, the cylindrical outer conductor 133 such as a conductive pipe, etc. is externally applied onto the low-pass filter 31 as shown in FIG. 14.

In the embodiment of FIG. 15, a coaxial cable 150 is connected to the axial low-pass filter 31, and in this case also, the axial low-pass filter 31 having the cylindrical outer conductor 133 (which may be made of an insulating tube or the like having a conductive layer applied to its inner peripheral surface in this figure) is to be adopted.

It is to be noted that in FIGS. 13 through 15, internal elements of the axial low-pass filter 31 are omitted for brevity.

As is clear from the foregoing description, according to the present invention, the filter device has been made compact in size by forming the low-pass filter into the axial shape, and moreover, such low-pass filter can be accommodated in the portion which has been regarded as a dead space in the conventional filter device, and thus, the spurious wave eliminating function may be provided, without altering the size of the conventional filter device on the whole.

Moreover, since the axial low-pass filter for the spurious wave elimination is shielded at its outer peripheral portion, it is free from leakage of electromagnetic waves, with superior high frequency characteristics, and is capable of positively eliminating the spurious component over a wide band region.

Furthermore, the axial low-pass filter having the construction similar to the coaxial connector or coaxial cable can be integrally connected to the coaxial connector and the like, and especially, in a position between the coaxial connectors, impedance matching may be effected in the state where the coaxial connectors are included.

Additionally, since the axial low-pass filter is of a simple construction, it can be readily manufactured, and thus, the filter device having the spurious wave eliminating function may be presented at low cost.

Although embodiments of the present invention have been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. In an electrical filter device which comprises a casing, filter elements in said casing, and input and output ports mounted on an outer wall of said casing, with said input and output ports being electrically connected to said filter elements, the improvement comprising at least one axial low-pass filter provided between said filter elements and one of said input and output ports, said axial low-pass filter further including an outer conductor having an axial bore, a plurality of capacitors arranged in said bore at predetermined intervals, each capacitor utilizing said outer conductor as an outer capacitor electrode, having an intermediate dielectric member with a cylindrical cross section, and having a conductive inner capacitor electrode, said inner capacitor electrodes of said capacitors being mounted at said predetermined intervals on an insulating axis member with spaces being defined therebetween, and at least one inductor mounted on said axis member in a space between a pair of adjacent said inner capacitor electrodes, and electrically connected to said pair of inner capacitor electrodes.

2. An electrical filter device as claimed in claim 1, wherein the wall portion of said casing has an axial bore formed therein which is commonly used as the outer conductor of said axial low-pass filter.

3. An electrical filter device as claimed in claim 2, wherein said one of said input and output ports is a coaxial connector which is physically attached to said low-pass filter to form a handleable unit.

4. An electrical filter device as claimed in claim 2, wherein said dielectric member comprises a heat-shrinkable tube.

5. An electrical filter device as claimed in claim 1, wherein said one of said input and output ports is a coaxial connector which is physically attached to said low-pass filter to form a handleable unit.

6. An electrical filter device as claimed in claim 5, wherein said dielectric member comprises a heat-shrinkable tube.

7. An electrical filter device as claimed in claim 1, wherein said dielectric member comprises a heat-shrinkable tube.

8. An electrical filter device as claimed in claim 1, wherein said axis member is an insulating rod and said inductor has a central portion wound around said rod and end portions in abutting electrical contact with said adjacent pair of inner capacitor electrodes.

9. An electrical filter device as claimed in claim 8, wherein said axial low-pass filter comprises two end capacitors and at least one intermediate capacitor, the inner electrodes of said two end capacitors having apertures in inner sides thereof for retaining the ends of said insulating rod, and the inner electrode of said intermediate capacitor having an axial aperture through which said insulating rod passes.

10. An electrical filter device as in claim 9, further comprising integral central conductors extending outwardly from outer sides of said inner electrodes of said two end capacitors.

* * * * *